United States Patent
Kempter et al.

(10) Patent No.: US 10,128,429 B2
(45) Date of Patent: Nov. 13, 2018

(54) PIEZOELECTRIC POSITIONING DEVICE AND POSITIONING METHOD BY MEANS OF SUCH A PIEZOELECTRIC POSITIONING DEVICE

(71) Applicant: Carl Zeiss SMT GmbH, Oberkochen (DE)

(72) Inventors: Christian Kempter, Wittislingen (DE); Ulrich Korten, Ulm (DE); Juergen Anic, Burgrieden (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 36 days.

(21) Appl. No.: 15/608,397

(22) Filed: May 30, 2017

(65) Prior Publication Data

US 2017/0263843 A1    Sep. 14, 2017

Related U.S. Application Data

(63) Continuation of application No. PCT/EP2015/077449, filed on Nov. 24, 2015.

(30) Foreign Application Priority Data

Nov. 27, 2014   (DE) .................. 10 2014 224 220

(51) Int. Cl.
*H01L 27/20*   (2006.01)
*H01L 41/04*   (2006.01)
(Continued)

(52) U.S. Cl.
CPC .......... *H01L 41/042* (2013.01); *G01Q 10/06* (2013.01); *G03F 7/70691* (2013.01);
(Continued)

(58) Field of Classification Search
CPC ..................... H01L 27/20; H01L 41/00; H01L 2224/79347
See application file for complete search history.

(56) References Cited

U.S. PATENT DOCUMENTS 5,034,874 A * 7/1991 Araki .................... H02M 7/219
                                                      363/127
5,268,621 A * 12/1993 Hamers .................. B82Y 15/00
                                                      310/317

(Continued)

FOREIGN PATENT DOCUMENTS

DE      19923462 C1    11/2000
JP      S6378582 A      4/1988
(Continued)

OTHER PUBLICATIONS

Office Action in corresponding German Application 102014224220.7, dated Jun. 25, 2015, 5 pages.
(Continued)

*Primary Examiner* — Bickey Dhakal
(74) *Attorney, Agent, or Firm* — Edell, Shapiro & Finnan, LLC

(57) ABSTRACT

A piezoelectric positioning device (1) has at least one piezoelectric actuator (3) having a first connection contact (4) and a second connection contact (5). A control device (6) with digital/analog converters (12, 16) connected to the connection contacts (4, 5) is used to control the at least one piezoelectric actuator (3). In comparison with a coarse converter (12), a fine converter (16) has a comparatively smaller voltage range and lower voltage levels, with the result that a high degree of positioning accuracy can be achieved.

18 Claims, 4 Drawing Sheets

(51) Int. Cl.
*G01Q 10/06* (2010.01)
*G03F 7/20* (2006.01)
*G05D 3/20* (2006.01)
*H02N 2/00* (2006.01)

(52) U.S. Cl.
CPC .............. *G05D 3/203* (2013.01); *H01L 41/04* (2013.01); *H02N 2/0075* (2013.01)

(56) References Cited

U.S. PATENT DOCUMENTS

| | | | |
|---|---|---|---|
| 5,361,014 A | * | 11/1994 | Antone ............... F02D 41/2096 |
| | | | 123/478 |
| 6,215,224 B1 | | 4/2001 | Kataoka et al. |
| 6,388,452 B1 | | 5/2002 | Picciotto |
| 8,659,407 B2 | | 2/2014 | Rudolf et al. |
| 2006/0047358 A1 | * | 3/2006 | Liang ................... B23B 29/125 |
| | | | 700/186 |
| 2008/0239494 A1 | | 10/2008 | Dennis |
| 2009/0015268 A1 | | 1/2009 | Delrae et al. |
| 2009/0269043 A1 | * | 10/2009 | Namuduri ............. B62D 5/046 |
| | | | 388/819 |
| 2011/0068657 A1 | * | 3/2011 | Sunaga ................. H01L 41/042 |
| | | | 310/316.01 |
| 2015/0188022 A1 | * | 7/2015 | Ko ....................... H01L 41/042 |
| | | | 310/318 |
| 2015/0340585 A1 | * | 11/2015 | Park ..................... H01L 41/042 |
| | | | 318/116 |

FOREIGN PATENT DOCUMENTS

| | | |
|---|---|---|
| JP | H02141694 A | 5/1990 |
| JP | 2000082244 A | 3/2000 |
| WO | 0063979 A1 | 10/2000 |
| WO | 2007022326 A2 | 2/2007 |
| WO | 2009011781 A1 | 1/2009 |
| WO | 2009047073 A1 | 4/2009 |

OTHER PUBLICATIONS

International Search Report and Written Opinion in counterpart International Application No. PCT/EP2015/077450, dated Feb. 3, 2016, 13 pages, with partial English translation, 2 pages.
International Search Report and Written Opinion in counterpart International Application No. PCT/EP2015/077449, dated Feb. 3, 2016, 13 pages, with partial English translation, 2 pages.

* cited by examiner

PIEZOELECTRIC POSITIONING DEVICE AND POSITIONING METHOD BY MEANS OF SUCH A PIEZOELECTRIC POSITIONING DEVICE

CROSS-REFERENCE TO RELATED APPLICATIONS

This is a Continuation of International Application PCT/EP2015/077449, which has an international filing date of Nov. 24, 2015, and the disclosure of which is incorporated in its entirety into the present Continuation by reference. The following disclosure is also based on and claims the benefit of and priority under 35 U.S.C. § 119(a) to German Patent Application No. DE 10 2014 224 220.7, filed Nov. 27, 2014, which is also incorporated in its entirety into the present Continuation by reference.

FIELD OF THE INVENTION

The invention relates to a piezoelectric positioning device and to a positioning method utilizing such a piezoelectric positioning device.

BACKGROUND

Piezoelectric actuators are known and are used to position kinematic systems in a highly accurate manner. Piezoelectric actuators are controlled using a digital/analog converter, with the result that the positioning accuracy of the piezoelectric actuators depends on the quantization levels or voltage levels of the analog output voltage of the digital/analog converter. The user has a constant need to increase the positioning accuracy of piezoelectric actuators.

SUMMARY

One object of the present invention is to provide a piezoelectric positioning device having at least one piezoelectric actuator, which positioning device enables a high degree of positioning accuracy in a simple and reliable manner.

According to one formulation of the invention, this object is addressed with a piezoelectric positioning device as described and claimed herein. In order to control the at least one piezoelectric actuator, the control device has two digital/analog converters. The first digital/analog converter, which is also referred to as a coarse converter below, has a first voltage range $\Delta U_1$, whereas the second digital/analog converter, which is also referred to as a fine converter below, has a smaller, second voltage range $\Delta U_2$. The second voltage range $\Delta U_2$ covers at least a first voltage level $\Delta u_1$ of the coarse converter, with the result that the positioning accuracy of the at least one piezoelectric actuator is determined by the second voltage levels $\Delta u_2$ of the fine converter. Since the second voltage levels $\Delta u_2$ of the fine converter are considerably lower than the first voltage levels $\Delta u_1$ of the coarse converter, the positioning accuracy of the piezoelectric positioning device can be increased in a simple and reliable manner. As a result of the fact that the at least one piezoelectric actuator can be operated in a potential-free manner, the digital/analog converters can be easily connected to the respective connection contacts. The piezoelectric actuator is preferably in the form of a piezo stack.

A positioning device according to claim 2 ensures a high degree of positioning accuracy in a simple manner. The coarse converter has a maximum voltage inaccuracy $\Delta u_d$ in the first voltage levels $\Delta u_1$, which is referred to as differential non-linearity and adversely affects the positioning accuracy. As a result of the fact that the second voltage range $\Delta U_2$ covers at least a sum of a first voltage level $\Delta u_1$ and the maximum voltage inaccuracy $\Delta u_d$, in particular twice the maximum voltage inaccuracy $\Delta u_d$, the fine converter can also at least partially compensate for a voltage inaccuracy $\Delta u_d$ which occurs. The second voltage range $\Delta U_2$ preferably covers at most 64 first voltage levels $\Delta u_1$ and, in particular, at most 32 first voltage levels $\Delta u_1$, with the result that the second voltage levels $\Delta u_2$ are as low as possible for achieving a high degree of positioning accuracy. The second voltage range $\Delta U_2$ is determined from the differential non-linearity and, in particular, from the noise of the coarse converter. The noise is generally oriented to the resolution or the first voltage levels $\Delta u_1$ of the coarse converter. Since the position is intended to be kept highly accurate in the steady or stable state during position regulation, changeover operations of the coarse converter must be avoided as far as possible in the stable state so that the position regulation is not disrupted. For this purpose, the second voltage range $\Delta U_2$ of the fine converter is selected to be as large as is permissible for the resolution required in the respective application and for the noise. Accordingly, the second voltage range $\Delta U_2$ is selected to be as small as possible under the condition that readjustment of the coarse converter is reliably avoided in the steady state.

A positioning device according to claim 3 ensures a high degree of positioning accuracy. The respective voltage amplifier can be optimally adapted to the associated digital/analog converter.

A positioning device according to claim 4 ensures a high degree of positioning accuracy. The non-reactive resistor is connected in series with the fine converter or the associated second voltage amplifier and attenuates the noise of the coarse converter and of the fine converter. The noise of the coarse converter is preferably attenuated by a low-pass filter, with the result that the dimensioning of the non-reactive series resistor is oriented to the noise of the first voltage amplifier on the analog side, to the noise of the fine converter, to any desired resolution for a current measurement via the series resistor for the purpose of regulating the charge, and to a required bandwidth for the voltage applied to the piezoelectric actuator, which results from a bandwidth requirement of the regulation with regard to compensating for interference. In comparison with the noise of the fine converter, the noise of the second voltage amplifier can generally be disregarded and accordingly has no significance for the dimensioning of the series resistor. The series resistor can also be used as a shunt or measuring resistor in order to measure the current flowing in the at least one piezoelectric actuator and to make it available to a digital regulating unit for regulating the charge.

A positioning device according to claim 5 ensures a high degree of positioning accuracy. The low-pass filter attenuates the noise and the dynamic response of the coarse converter, whereas the dynamic response of the fine converter is not adversely affected. As a result, the positioning device has a high dynamic response and a high degree of positioning accuracy. The cut-off frequency of the low-pass filter is determined from the required maximum movement speed which causes a maximum voltage change at the piezoelectric actuator. A compensation low-pass filter is preferably provided in a calculation unit for calculating a first voltage value for the first digital/analog converter and a second voltage value for the second digital/analog converter, with the result that the low-pass-attenuated dynamic response of the first converter/amplifier circuit is compensated for by the second converter/amplifier circuit. The cut-off frequency of this compensation low-pass filter accordingly results from the required maximum movement speed.

A positioning device according to claim 6 enables highly accurate position regulation. The position measuring sensor provides the control device with an actual position of the at least one piezoelectric actuator and/or of the kinematic system to be regulated.

A positioning device according to claims 7 and 8 ensures a desired degree of positioning accuracy with a high degree of reliability. The position regulating unit makes it possible to regulate the measured actual position to a predefined desired position. For this purpose, the position regulating unit is designed, in particular, in such a manner that a steady-state control error does not occur. In particular, the position regulating unit has a regulator with an integrating portion. The regulator is in the form of a PID regulator, for example. The position regulating unit preferably has a desired value filter which predefines a desired position taking into account the physical limits for an acceleration and/or speed of the at least one piezoelectric actuator. The desired value filter has the function of a path generator, in particular.

A positioning device according to claim 9 ensures a high degree of positioning accuracy in conjunction with a high dynamic response. The position pilot control unit provides a pilot control manipulated variable which is converted by the digital/analog converters into a respective output voltage substantially without delay. As a result, the position regulation has a high dynamic response. The position pilot control unit interacts with the position regulating unit, with the result that the pilot control manipulated variable and a regulation manipulated variable are added to form an overall manipulated variable.

A positioning device according to claim 10 ensures a high degree of steady-state accuracy of the position regulating unit in a simple and reliable manner. The detection unit generates a control signal if the absolute value of a predefined control error limit value is undershot. The control signal can therefore be used to identify when the position regulating unit or the position regulation changes to a steady or stable state. For example, parameters of the position regulating unit and/or of a calculation unit for controlling the coarse and fine converters may be changed on the basis of the control signal in order to avoid an undesirable change in the first converter output voltage $U_1$ in the steady state of the position regulation. The control signal is preferably generated if the position control error undershoots the predefined control error limit value for a minimum period. If a desired value limiter and/or a desired value filter is/are used, the control signal is preferably generated when the filtered desired position additionally corresponds to the predefined desired position or to the maximum desired position limited by the desired value limiter.

A positioning device according to claim 11 ensures a high degree of positioning accuracy in a simple and reliable manner. The calculation unit uses a desired voltage value to calculate a first voltage value for the coarse converter and a second voltage value for the fine converter, which values must be provided by the coarse converter and the fine converter as analog converter output voltages. The first voltage value for the coarse converter is preferably calculated first, with the result that the required second voltage value of the fine converter for converting the desired voltage value is substantially in the center of the second voltage range $\Delta U_2$. As a result, the fine converter has an equally large voltage range available, if the desired voltage value changes in the positive and negative directions, in order to convert the change in the desired voltage value using the second voltage value. This ensures that the first voltage value of the coarse converter is changed substantially only when the change in the desired voltage value can no longer be converted using the second voltage value or the fine converter. In an instantaneous time step, the calculation unit preferably calculates a required first voltage value and compares it with a first voltage value which was calculated in an earlier time step. If a difference absolute value of the desired voltage value and of the first voltage value for the earlier time step exceeds a limit value, the earlier first voltage value is replaced with the instantaneous first voltage value. The limit value is greater than zero, but is at most $\Delta U_2/2$, for example.

A positioning device according to claim 13 ensures a high degree of positioning accuracy in a steady state of the position regulation. As a result of the fact that the limit value is changed or increased in a steady state of the position regulation, it can be enforced that changes in the converter output voltage of the coarse converter become extremely unlikely at a fixed position during position regulation. This makes it possible to avoid undesirable changes in the output voltage of the coarse converter in a steady state of the position regulation. In the dynamic state of the position regulation, the limit value is set to $\Delta U_2/4$, for example, with the result that readjustment of the coarse converter is enforced or forced before the steady state is reached or detected. If a steady state is detected, the limit value is set to $\Delta U_2/2$, for example, as a result of which changes in the output voltage of the coarse converter for compensating for interference become unlikely.

A positioning device according to claim 14 ensures a high degree of positioning accuracy. As a result of the fact that a measurement voltage is determined at the non-reactive resistor or series resistor, this measurement voltage can be used to set up voltage regulation or charge regulation for the at least one piezoelectric actuator. The voltage regulation or charge regulation provides an internal control loop which is superimposed with the position regulation as an external control loop.

A positioning device according to claim 15 ensures a high degree of positioning accuracy. The charge regulating unit makes it possible to avoid or compensate for hysteresis effects of the at least one piezoelectric actuator. The charge regulating unit which provides an internal control loop exactly sets an actual state of charge of the at least one piezoelectric actuator, the desired state of charge being predefined, in particular, by the position regulating unit which forms an external position control loop.

The piezoelectric positioning device according to any one of claims 1 to 15 can be advantageously used for a projection exposure apparatus. This makes it possible, in particular, to position at least one component of the projection exposure apparatus, for example a lens element, a mirror and/or a plate to be bent, with a high degree of accuracy.

The invention is also based on the object of providing a positioning method which enables a high degree of positioning accuracy in a simple and reliable manner.

This object is addressed with a positioning method having the features of claim 17. The advantages of the positioning method according to the invention correspond to the advantages of the piezoelectric positioning device according to the invention which have already been described. The positioning method can also be developed, in particular, with the features of claims 1 to 15. The positioning method is preferably used in a projection exposure apparatus.

BRIEF DESCRIPTION OF THE DRAWINGS

Further features, advantages and details of the invention can be gathered from the following description of an exemplary embodiment. In the figures.

DETAILED DESCRIPTION

Figure 1:
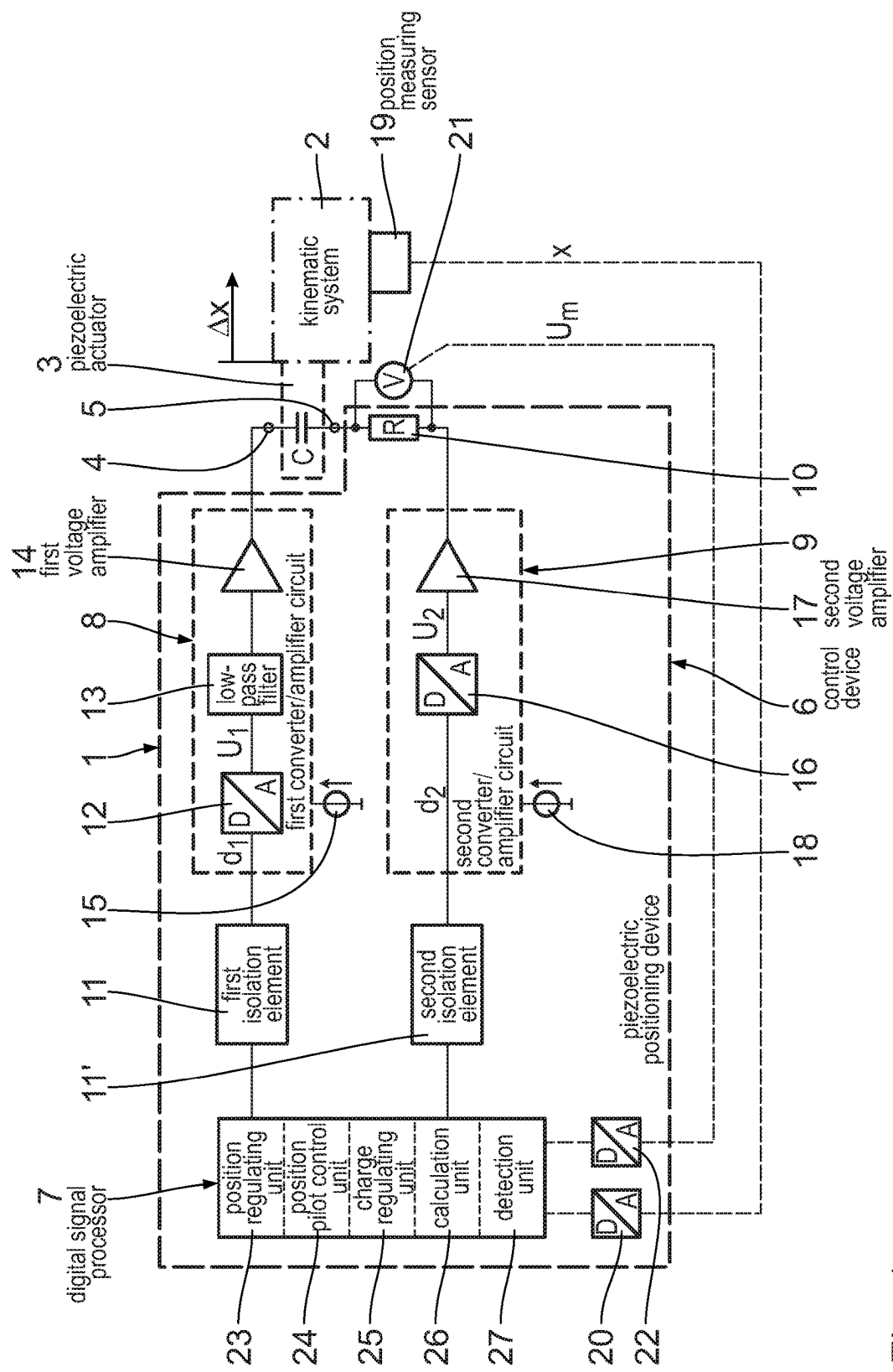
FIG. 1 shows a schematic illustration of the structure of a piezoelectric positioning device having a piezoelectric actuator which is controlled using a first digital/analog converter and a second digital/analog converter.

A piezoelectric positioning device 1 has a piezoelectric actuator 3 for positioning a kinematic system 2. In electrical terms, the piezoelectric actuator 3 acts as a capacitor with a capacitance C and changes a longitudinal dimension on the basis of an actual state of charge. The change in the longitudinal dimension is denoted Δx. The piezoelectric actuator 3 is known and conventional and is in the form of a piezo stack, for example.

The piezoelectric actuator 3 is connected to a control device 6 via connection contacts 4, 5. The control device 6 has a digital signal processor 7. A first converter/amplifier circuit 8 has a signal connection to the digital signal processor 7, but is DC-isolated from the latter by a first isolation element 11. The first converter/amplifier circuit 8 is connected to the first connection contact 4. A second converter/amplifier circuit 9 is connected to the second connection contact 5 via a non-reactive series resistor 10. The series resistor 10 has the resistance value R. The second converter/amplifier circuit 9 has a signal connection to the digital signal processor 7, but is DC-isolated from the latter by a second isolation element 11'.

The first converter/amplifier circuit 8 has a first digital/analog converter 12 which is connected to a first voltage amplifier 14 via a low-pass filter 13. The first digital/analog converter 12 has a first voltage range $\Delta U_1$ and provides a first analog converter output voltage $U_1$ in first voltage levels $\Delta u_1$. The first converter/amplifier circuit 8 is connected to a first voltage source 15 which provides a first shift voltage. The first shift voltage shifts a reference potential of the first converter/amplifier circuit 8 with respect to the reference potential (GROUND GND). This requires the DC isolation by the isolation element 11' between the digital signal processor 7 and the first converter/amplifier circuit 8.

The second converter/amplifier circuit 9 has a second digital/analog converter 16 which is connected to a second voltage amplifier 17. The second digital/analog converter 16 has a second voltage range $\Delta U_2$ and provides a second analog converter output voltage $U_2$ in second voltage levels $\Delta u_2$. The second converter/amplifier circuit 9 is connected to a second voltage source 18 which provides a second shift voltage. The second shift voltage shifts a reference potential of the second converter/amplifier circuit 9 with respect to the reference potential. This requires the DC isolation by the isolation element 11' between the digital signal processor 7 and the second converter/amplifier circuit 9. If the second shift voltage is 0 V, the second isolation element 11' is not required. However, DC isolation by the isolation element 11' may be useful for safety reasons since, in the event of a fault, the digital signal processor 7 is electrically separated in this manner from components of the second converter/amplifier circuit 9 which possibly carry high voltage. A corresponding situation applies to the first shift voltage and the first isolation element 11.

The second converter/amplifier circuit 9 is preferably operated symmetrically with respect to the reference potential, with the result that it is possible to dispense with DC isolation by the second isolation element 11'. For this purpose, the second shift voltage is set to 0 V. This is advantageous, on the one hand, since a current measurement via the non-reactive series resistor 10 is usually carried out using a digital/analog converter with a differential input or a corresponding preamplifier, the common-mode signal of the differential input or differential preamplifier usually being limited to ±5 V with respect to the reference potential. On the other hand, it is advantageous, for safety reasons, to leave the voltage potential of a connection contact 4, 5 in the vicinity of the reference potential. If one of the connection contacts 4, 5 inadvertently makes contact with the reference potential or the frame ground of the piezoelectric positioning device 1, for example during a start-up measurement, this does not result in depolarization or destruction of the piezoelectric actuator 3.

If the operating range of the piezoelectric actuator 3 is, for example, −20 V to 120 V and the first voltage range $\Delta U_1$ is 0 V to 135 V and the second voltage range $\Delta U_2$ is −2.5 V to 2.5 V, the first shift voltage is set to −17.5 V and the second shift voltage is set to 0 V. This ensures that, in the event of a fault—irrespective of which connection contact 4, 5 touches the reference potential or the frame ground, at most −17.5 V to 117.5 V are applied across the piezoelectric actuator 3, that is to say the voltage applied in the event of a fault is in the operating range of the piezoelectric actuator 3.

The first digital/analog converter 12 has n bits, with the result that a first digital input can accept $2^n$ input values $d_1$. The first voltage levels $\Delta u_1$ are determined by the first voltage range $\Delta U_1$ and the $2^n$ digital input values $d_1$. The second digital/analog converter 16 accordingly has m bits, with the result that a second digital input can accept $2^m$ input values $d_2$. The second voltage levels $\Delta u_2$ are determined by the second voltage range $\Delta U_2$ and the $2^m$ input values $d_2$. The first digital/analog converter 12 is used to provide the converter output voltage $U_1$ in a large voltage range $\Delta U_1$ and in high voltage levels $\Delta u_1$, whereas the second digital/analog converter 16 is used to provide the second converter output voltage $U_2$ in a smaller voltage range $\Delta U_2$ and in lower voltage levels $\Delta u_2$. Accordingly, the first digital/analog converter 12 is also referred to as a coarse converter 12 below, whereas the second digital/analog converter 16 is also referred to as a fine converter 16 below. The following accordingly applies:

$$\Delta U_1 > \Delta U_2 \text{ and } \Delta u_1 > \Delta u_2.$$

In addition, the second voltage range $\Delta U_2$ covers at least one first voltage level $\Delta u_1$, with the result that the following applies:

$$\Delta U_2 \geq \Delta u_1.$$

Figure 2:
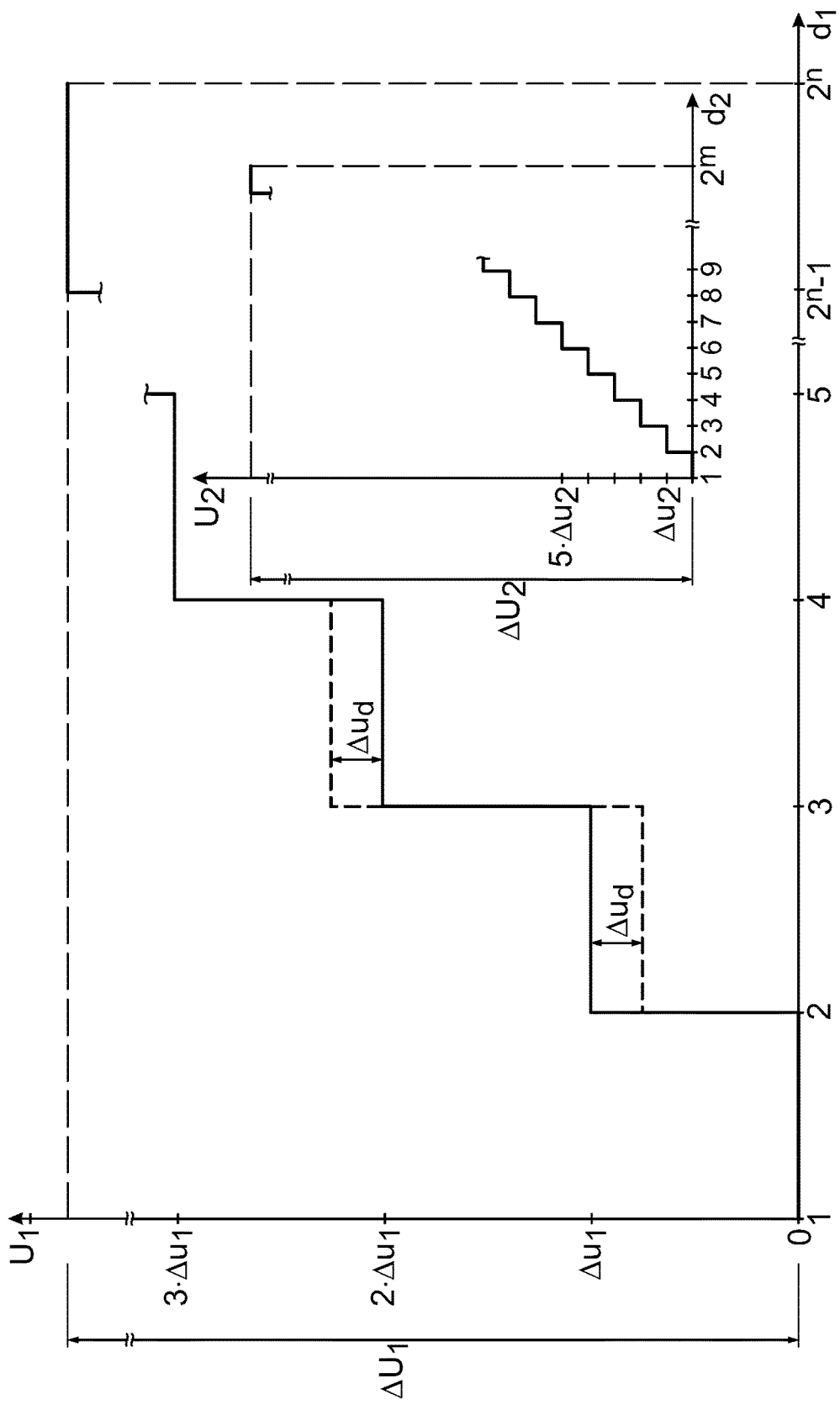
FIG. 2 shows a schematic illustration of the characteristic curves of the digital/analog converters.
Figure 3:
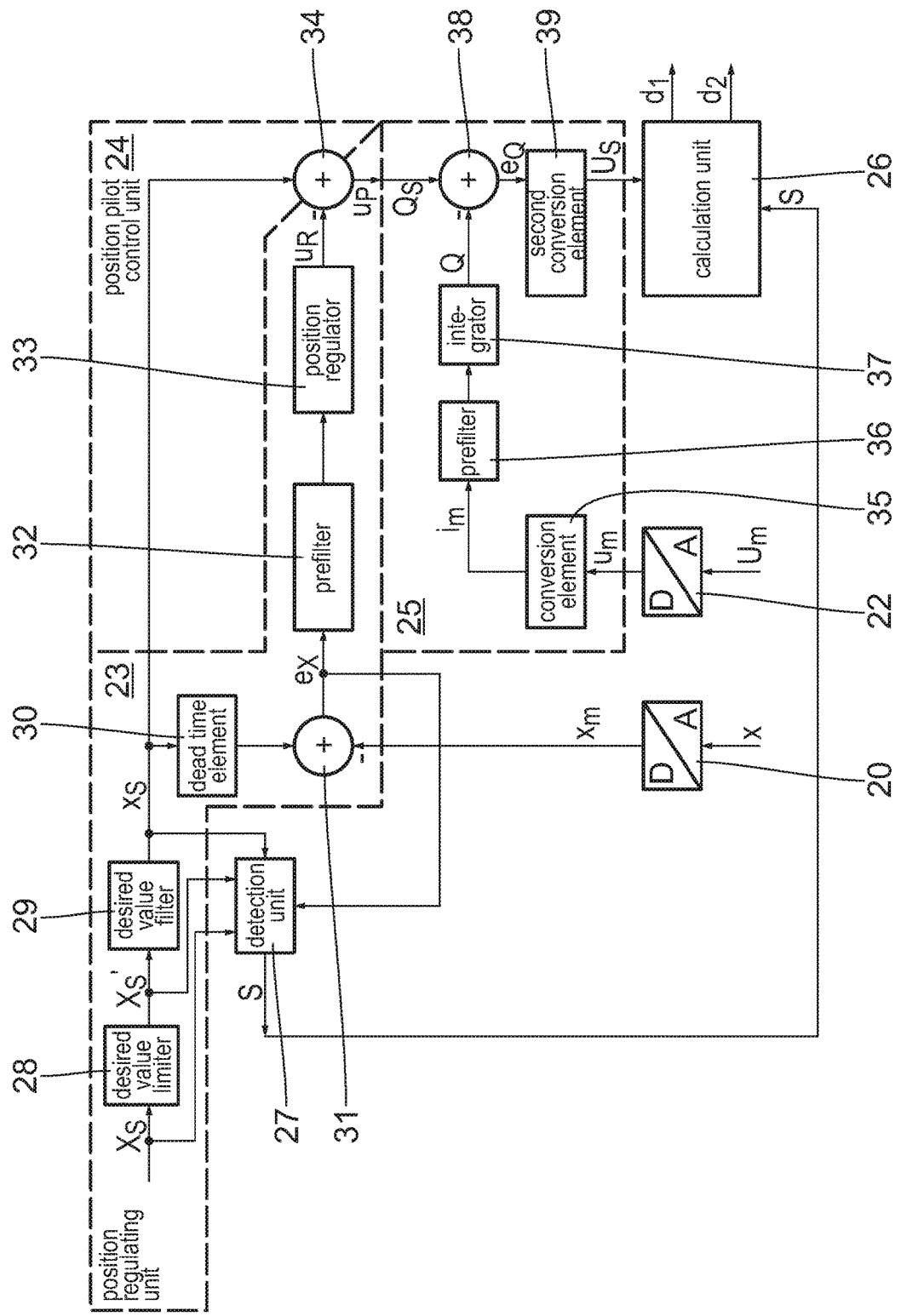
FIG. 3 shows a signal flow diagram of position regulation for the piezoelectric actuator with a calculation unit for calculating voltage values for the digital/analog converters.

These relationships are illustrated in FIG. 2.

The first voltage levels $\Delta u_1$ in practice have a voltage inaccuracy. A maximum voltage inaccuracy $\Delta u_d$ is illustrated by way of example in FIG. 2. In the worst-case scenario, the maximum voltage inaccuracy $\Delta u_d$ can occur in a negative direction in one voltage level $\Delta u_1$ and can occur in a positive direction in a subsequent voltage level $\Delta u_1$. This is illustrated by way of example for the voltage levels $\Delta u_1$ and $2 \cdot \Delta u_1$ in FIG. 2. Voltage inaccuracies which occur are also known as differential non-linearities in digital/analog converters. The following preferably accordingly applies to the second voltage range $\Delta U_2$:

$$\Delta U_2 \leq \Delta u_1 + \Delta u_d, \text{ in particular } \Delta U_2 \geq \Delta u_1 + 2 \cdot u_d.$$

The positioning accuracy of the piezoelectric actuator 3 is dependent on the second voltage levels $\Delta u_2$, that is to say the resolution of the fine converter 16. The positioning accuracy is accordingly higher, the lower the second voltage levels $\Delta u_2$. The following preferably applies to the second voltage range $\Delta U_2$:

$$\Delta U_2 \leq 64 \cdot \Delta u_1, \text{ in particular } \Delta U_2 \leq 32 \cdot \Delta u_1.$$

This ensures second voltage levels $\Delta u_2$ which are as low as possible for a given number of bits m.

In order to measure an actual position x to be regulated, the positioning device 1 has a position measuring sensor 19. The position measuring sensor 19 measures, for example, the actual position x of a component of the kinematic system 2 to be positioned. The position measuring sensor 19 can also measure, for example, the actual position x or the adjustment travel of the piezoelectric actuator 3. The position measuring sensor 19 has a signal connection to the control device 6 and provides the digital signal processor 7 with digital measured values $x_m$ of the actual position x via a first analog/digital converter 20.

The series resistor 10 is used as a shunt or measuring resistor in order to determine the current which has flowed to the piezoelectric actuator 3. For this purpose, the positioning device 1 has a voltage measuring sensor 21 which measures a voltage $U_m$ dropped across the series resistor 10. The voltage measuring sensor 21 has a signal connection to the control device 6 and provides the digital signal processor 7 with digital measured values $u_m$ of the voltage $U_m$ via a second analog/digital converter 22.

The control device 6 is used to regulate the actual position x and an actual state of charge Q of the piezoelectric actuator 3. The charge regulation forms an internal control loop, whereas the position regulation forms an external control loop which is superimposed on the internal control loop. In order to regulate the position and charge, the digital signal processor 7 forms a position regulating unit 23, a position pilot control unit 24, a charge regulating unit 25, a calculation unit 26 and a detection unit 27.

A desired position $X_S$ is first of all supplied to a desired value limiter 28 and any limited desired position $X_S'$ is supplied to a desired value filter 29 in the position regulating unit 23. The desired value filter 29 has the function of a path generator and takes into account physical limits of the piezoelectric actuator 3, in particular. The desired value filter 29 provides a calculated second desired position $x_S$ on the output side. Using a first adder 31, the measured and digitized actual position $x_m$ is subtracted from the desired position $x_S$ and a position control error $e_X$ is calculated. Any dead times of the kinematic system 2 and/or of the positioning device 1 can be taken into account using a dead time element 30 upstream of the adder 31. The position control error $e_X$ is supplied to a prefilter 32 and to a downstream position regulator 33. The position regulator 33 provides a regulation manipulated variable $u_R$ on the output side. The position regulating unit 23 interacts with the position pilot control unit 24. For this purpose, the desired position $x_S$, as a pilot control manipulated variable, is added to the regulation manipulated variable $u_R$, using of a second adder 34, to form an overall manipulated variable $u_P$.

The manipulated variable $u_P$ provides a desired state of charge $Q_S$ for the charge regulating unit 25. The charge regulating unit 25 is also supplied with the digitized measurement voltage $u_m$ which is converted, in a conversion element 35 having the resistance value R, into a current $i_m$ which is filtered in a prefilter 36 and is then integrated by an integrator 37. The integrator 37 provides an actual state of charge Q of the piezoelectric actuator 3 on the output side. The actual state of charge Q is subtracted from the desired state of charge $Q_S$ by a third adder 38, with the result that the third adder 38 outputs a charge control error $e_Q$ on the output side. The charge control error $e_Q$ is converted, in a second conversion element 39, into a desired voltage value $U_S$ which is intended to be output by the digital/analog converters 12, 16 as a sum of the analog converter output voltages $U_1$ and $U_2$.

The desired voltage value $U_S$ is supplied to the calculation unit 26 which calculates the digital input values $d_1$ and $d_2$ for the digital/analog converters 12 and 16. The calculation unit 26 is also supplied with a control signal S which is generated by the detection unit 27. For this purpose, the detection unit 27 is supplied with the desired positions $X_S$, $X_S'$ and $x_S$ and the position control error $e_X$. The detection unit 27 is designed in such a manner that a control signal S is generated if $X_S=x_S$ or $X_S'=x_S$ and the absolute value of the position control error $e_X$ undershoots a predefined control error limit value for a minimum period. In this case, the detection unit 27 detects a stable or steady state of the position regulation. If a steady state is detected for example, S=1 applies to the control signal S, otherwise S=0.

Figure 4:
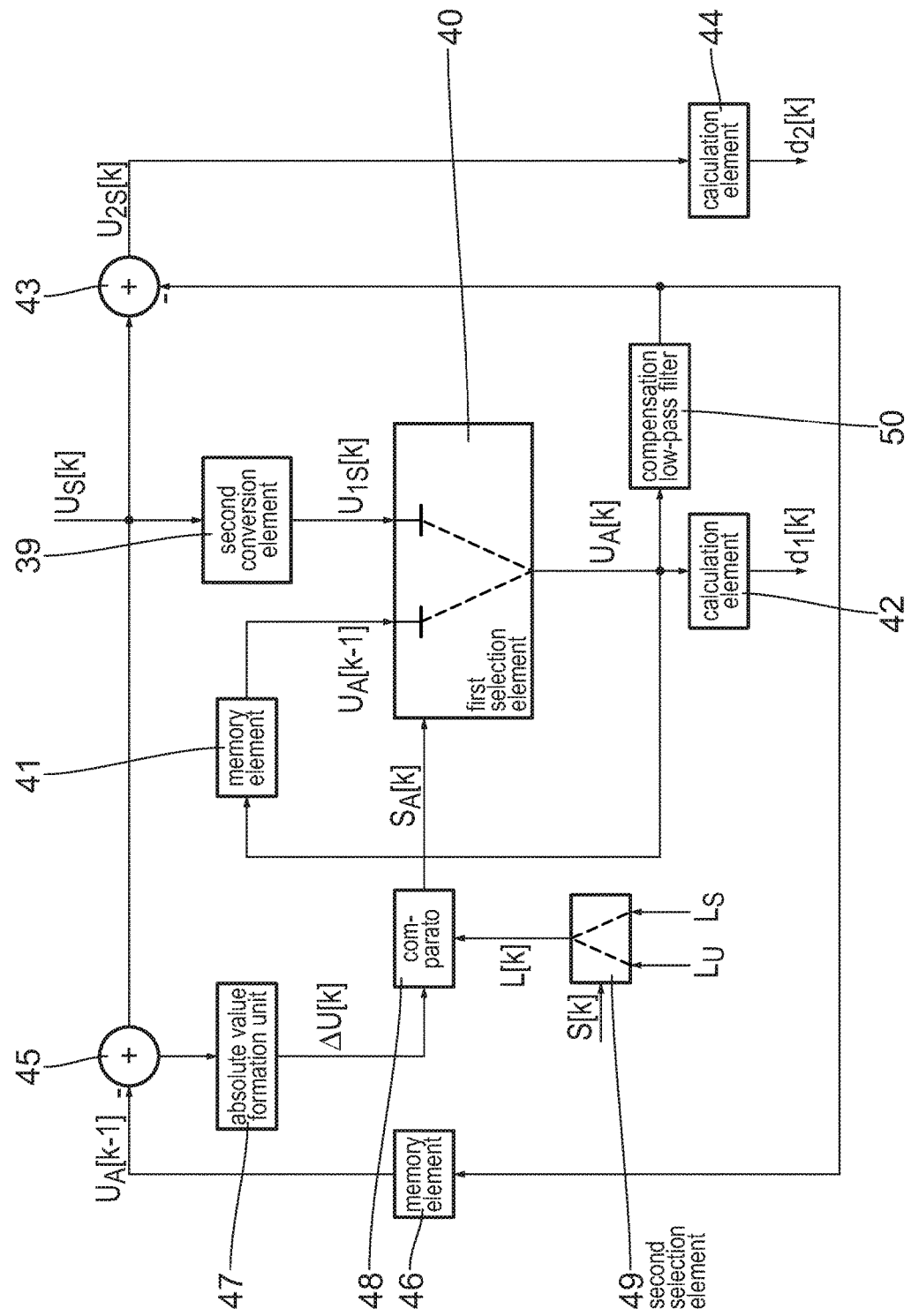
FIG. 4 shows a signal flow diagram of the calculation unit for calculating a first voltage value for the first digital/analog converter and a second voltage value for the second digital/analog converter.

The calculation unit 26 is illustrated in detail in FIG. 4. In order to illustrate time steps, the instantaneous time step is indicated as [k] and the previous time step is indicated by [k−1]. A required first voltage value $U_{1S}[k]$ for the coarse converter 12 is calculated from the desired voltage value $U_S[k]$ by a conversion element 39. The first voltage value $U_{1S}[k]$ takes into account the parameters of the coarse converter 12, for example the first voltage range $\Delta U_1$ and the first voltage levels $\Delta u_1$ and/or the resolution. This first voltage value $U_{1S}[k]$ is supplied to a first selection element 40. The selection element 40 is also supplied with an output voltage value $U_A[k−1]$ of the selection element 40, which output voltage value is stored in a memory element 41.

The selection element 40 selects between $U_{1S}[k]$ and $U_A[k−1]$ on the basis of a switching signal $S_A[k]$. If $S_A[k]=1$, the selection element 40 selects the first voltage value $U_{1S}[k]$ as the instantaneous output voltage value $U_A[k]$ and otherwise selects the earlier output voltage value $U_A[k−1]$, that is to say if $S_A[k]=0$. The output voltage value $U_A[k]$ specifies the analog first converter output voltage $U_1$ to be output by the coarse converter 12, in which case the corresponding digital input value $d_1$ for the coarse converter 12 is calculated in the calculation element 42.

The output voltage value $U_A[k]$ is also supplied to a compensation low-pass filter 50. The compensation low-pass filter 50 ensures that the dynamic response of the first converter/amplifier circuit 8, which has been subjected to low-pass attenuation on account of the low-pass filter 13, is compensated for by the second converter/amplifier circuit 9. This means that the entire dynamic response is available for compensating for interference during the small-signal behavior for the voltage at the piezoelectric actuator 3. The cut-off frequency of the low-pass filter 13 and therefore also the cut-off frequency of the compensation low-pass filter 50 are determined from the required maximum movement speed of the piezoelectric actuator 3.

Using a fourth adder 43, the low-pass-filtered output voltage value $U_A[k]$ for the coarse converter 12 is subtracted from the desired voltage value $U_S[k]$, with the result that the adder 43 outputs a second voltage value $U_{2S}[k]$ which is intended to be output by the fine converter 16 as a second analog converter output voltage $U_2$. This second voltage value $U_{2S}[k]$ is converted into the digital input value $d_2$ for the fine converter 16 in a calculation element 44.

In order to calculate the switching signal $S_A[k]$, the output voltage value $U_A[k-1]$ from the previous time step, which is stored in a memory element 46, is subtracted from the desired voltage value $U_S[k]$ by a fifth adder 45. The adder 45 outputs a voltage difference, for which a difference absolute value $\Delta U[k]$ is formed by an absolute value formation unit 47. The difference absolute value $\Delta U[k]$ is supplied to a comparator 48 which compares it with a limit value $L[k]$. If the difference absolute value $\Delta U[k]$ exceeds the limit value $L[k]$, the switching signal $S_A[k]=1$ is output and results in the selection of the first voltage value $U_{1S}[k]$ in the selection element 40. Otherwise, the switching signal $S_A[k]=0$ is output and results in the selection of the earlier output voltage value $U_A[k-1]$ in the selection element 40.

A second selection element 49 selects between a first limit value $L_U$ and a second limit value $L_S$ on the basis of the control signal $S[k]$ provided by the detection unit 27 and provides the instantaneous limit value $L[k]$ on the basis of the selection. The first limit value $L_U$ is selected if the control signal $S[k]$ characterizes an unstable or dynamic state of the position regulation, whereas the second limit value $L_S$ is selected if the control signal $S[k]$ characterizes a stable or steady state of the position regulation. The following holds true:

$$L_U < L_S.$$

This ensures that a change in the first converter output voltage $U_1$ becomes unlikely in a stable state of the position regulation.

The piezoelectric positioning device 1 is part of a projection exposure apparatus, for example, at least one component of the projection exposure apparatus, for example a mirror, a lens element and/or a plate to be bent, being able to be positioned in a highly accurate manner with the piezoelectric positioning device 1.

The method of operation of the positioning device 1 is as follows:

In order to set a desired position $X_S$, a suitable trajectory and the associated desired position $x_S$ are calculated by the desired value limiter 28 and the desired value filter 29. The position control error $e_X$ is determined from the desired position $x_S$ and the digitized actual position $x_m$, which was determined by the position measuring sensor 19, and is supplied, via the prefilter 32, to the position regulator 33 which outputs the regulation manipulated variable $u_R$. The position regulator 33 is in the form of a PID regulator, for example. The desired position $x_S$ is additionally added via the position pilot control unit 24 and the resulting desired state of charge $Q_S$ of the piezoelectric actuator 3 is supplied to the charge regulating unit 25.

The charge regulating unit 25 calculates a charge control error $e_Q$ and outputs, on the output side, the required desired voltage value $U_S$ which must be converted by the digital/analog converters 12 and 16 into the analog converter output voltages $U_1$ and $U_2$. In order to calculate the charge control error $e_Q$, the digitized measurement voltage $u_m$ is converted into a current $i_m$ and is integrated to form the actual state of charge Q.

In the manner already described, the calculation unit 46 is used to calculate the digital input values $d_1$ and $d_2$ for the digital/analog converters 12, 16 from the desired voltage value $U_S$. In this case, the position regulation is initially in a dynamic state, with the result that the detection unit 27 transmits a corresponding control signal S to the calculation unit 26 which uses the first limit value $L_U$ for the comparator 48.

The digital/analog converters 12, 16 provide the desired analog converter output voltages $U_1$ and $U_2$ in a manner corresponding to the input values $d_1$ and $d_2$ and their characteristic curves. The converter output voltage $U_1$ is filtered by the low-pass filter 13 and is then applied to the piezoelectric actuator 3 in a form amplified in a desired manner by the voltage amplifier 14. A noise signal of the coarse converter 12 is attenuated by the low-pass filter 13 and the series resistor 10. In comparison, the converter output voltage $U_2$ is amplified by the second voltage amplifier 17 without a low-pass filter and is applied to the piezoelectric actuator 3 since the second voltage levels $\Delta u_2$ are considerably lower than the first voltage levels $\Delta u_1$. The positioning accuracy of the piezoelectric actuator 3 is therefore determined by the second voltage levels $\Delta u_2$.

As a result of the converter output voltages $U_1$ and $U_2$ which have been set, the piezoelectric actuator 3 changes its longitudinal extent by $\Delta x$ and therefore sets the desired actual position x. If a substantially steady state of the position regulation is achieved, the detection unit 27 detects this and provides the calculation unit 26 with a corresponding control signal S. The calculation unit 26 accordingly uses the larger, second limit value $L_S$ for the comparator, as a result of which the coarse converter 12 changes its set converter output voltage $U_1$ again only when a change in the desired voltage value $U_S$ cannot be set using the fine converter 16.

The first limit value $L_U$ is $\Delta U_2/4$, for example, as a result of which changes to the coarse converter 12 are forced in the dynamic state of the position regulation. In contrast, the second limit value $L_S$ is $\Delta U_2/2$, for example, as a result of which the second voltage range $\Delta U_2$ of the fine converter 16 is optimally utilized.

The positioning device according to the invention and the two-stage digital/analog converter concept according to the invention having a coarse converter and a fine converter therefore enable highly accurate position regulation of piezoelectric actuators, in particular piezo stacks, using voltage or charge control. The entire adjustment range or movement range is preferably enabled via the longitudinal extent of a single piezo stack. As a result of the fact that piezo stacks react immediately and directly to voltage or charge changes, highly dynamic position regulation is also enabled. The at least one piezoelectric actuator or the at least one piezo stack preferably consists of a ceramic which is not conductive. As a result, the piezoelectric actuator can be operated in a potential-free manner, in particular. As a result of the measurement at the series resistor, it is also possible to diagnose system faults, for example cable breaks and/or short circuits. As a result of the subdivision into a coarse converter and a fine converter, it is possible to deliberately avoid differential non-linearities since small position control errors can always be compensated for using the fine converter and the converter output voltage of the coarse converter is changed only in the case of comparatively large position changes. The control concept for the coarse converter and for the fine converter is fundamentally such that a changed desired voltage value is intended to be set using the fine converter if possible, with the result that there is no need to change the coarse converter. If this is not possible, both the coarse converter and the fine converter are changed and set in such a manner that the fine converter is as close as possible to its central position or is in the center of its voltage range. This is ensured by the calculation unit. The number of desired value changes of the coarse converter is minimized by the calculation unit, with the result that the differential non-linearity of the coarse converter acts only in an isolated manner as a one-off interference variable in the position control loop and can be compensated for by the position control loop without any problems. Linking the calculation unit to the detection unit also ensures that a change in the coarse converter does not occur in a steady state of the position regulation, that is to say if the actual position set is intended to be retained exactly. Combining the desired value distribution among the coarse converter and the fine converter with the path generator of the position regulation adjusts or readjusts the coarse converter in such a manner that a voltage range which is as identical as possible in the positive and negative directions is available with the fine converter. As a result, voltage changes needed to retain the actual position in a highly accurate manner can be applied by the fine converter alone.

Selecting the supply voltages makes it possible to easily adapt the positioning device according to the invention to the voltage range of the piezoelectric actuator and to reliably protect the latter from overvoltages. The digital charge regulation makes it possible to substantially avoid hysteresis effects of the piezoelectric actuator. If piezo stacks made of low-voltage ceramics are used, a power-saving and highly integrated structure of the positioning device is possible. The number of components is comparatively small, with the result that an adverse effect caused by noise, thermal drift, or component variances is small.

Overall, the positioning device according to the invention enables highly accurate and highly dynamic position regulation in a simple and reliable manner. The positioning device according to the invention is suitable, in principle, for positioning any desired kinematic systems or their components.

What is claimed is:

1. A piezoelectric positioning device comprising:
    at least one piezoelectric actuator comprising, respectively, a first connection contact and a second connection contact,
    a control device configured to control the at least one piezoelectric actuator, and comprising:
        a first digital/analog converter connected to the first connection contact and providing a first analog converter output voltage $U_1$ in a first voltage range $\Delta U_1$ in first voltage levels $\Delta u_1$,
        wherein the first digital/analog converter has n bits and a first digital input of the first digital/analog converter accepts $2^n$ digital input values, wherein the first voltage levels $\Delta u_1$ are determined by the first voltage range $\Delta U_1$ and the $2^n$ digital input values,
        a second digital/analog converter connected to the second connection contact and providing a second analog converter output voltage $U_2$ in a second voltage range $\Delta U_2$ in second voltage levels $\Delta u_2$,
        wherein the second digital/analog converter has m bits and a second digital input of the second digital/analog converter accepts $2^m$ digital input values, wherein the second voltage levels $\Delta u_2$ are determined by the second voltage range $\Delta U_2$ and the $2^m$ digital input values, where: $\Delta U_1 > \Delta U_2 \geq \Delta u_1 > \Delta u_2$.

2. The positioning device as claimed in claim 1, wherein the first voltage levels $\Delta u_1$ have a maximum voltage inaccuracy $\Delta u_d$, where: $\Delta U_2 \geq \Delta u_1 + \Delta u_d$ and/or $\Delta U_2 \leq 64 \cdot \Delta u_1$.

3. The positioning device as claimed in claim 1, further comprising a first voltage amplifier arranged downstream of the first digital/analog converter and a second voltage amplifier is arranged downstream of the second digital/analog converter.

4. The positioning device as claimed in claim 3, further comprising a low-pass filter connected between the first digital/analog converter and the first voltage amplifier.

5. The positioning device as claimed in claim 1, further comprising a non-reactive resistor connected between the second digital/analog converter and the second connection contact.

6. The positioning device as claimed in claim 5, further comprising a voltage measuring sensor determining a measurement voltage ($u_m$) corresponding to a voltage ($U_m$) dropped across the non-reactive resistor.

7. The positioning device as claimed in claim 6, wherein the control device comprises a charge regulating unit regulating an actual state of charge (Q) of the at least one piezoelectric actuator designed to determine the actual state of charge (Q) from the measurement voltage ($u_m$) and to compare the actual state of charge with a desired state of charge ($Q_S$).

8. The positioning device as claimed in claim 7, wherein the desired state of charge ($Q_S$) is predefined by a position regulating unit.

9. The positioning device as claimed in claim 1, further comprising a position measuring sensor configured to measure an actual position (x) regulated via the at least one piezoelectric actuator.

10. The positioning device as claimed in claim 9, wherein the control device comprises a position regulating unit regulating the actual position (x).

11. The positioning device as claimed in claim 10, wherein the position regulating unit comprises a filter to filter a desired position value.

12. The positioning device as claimed in claim 10, wherein the control device comprises a position pilot control unit which interacts with the position regulating unit.

13. The positioning device as claimed in claim 9, wherein the control device comprises a detection unit configured to generate a control signal (S) if the absolute value of a position control error ($e_x$) undershoots a predefined control error limit value.

14. The positioning device as claimed in claim 1, wherein the control device comprises a calculation unit calculating a first input value ($d_1$) for the first digital/analog converter and a second input value ($d_2$) for the second digital/analog converter from a desired voltage value ($U_S$).

15. The positioning device as claimed in claim 14, wherein the calculation unit is programmed to replace a first voltage value ($U_{1S}$) calculated in an instantaneous time step (k) with a first voltage value ($U_A$) calculated in an earlier time step (k−1) if a difference absolute value ($\Delta U$) of the desired voltage value ($U_S$) and of the first voltage value ($U_A$) in the earlier time step (k−1) exceeds a limit value (L).

16. The positioning device as claimed in claim 15, wherein the calculation unit changes the limit value (L) in accordance with a control signal (S).

17. A positioning method, comprising:
    providing the piezoelectric positioning device as claimed in claim 1, and
    actuating the piezoelectric positioning device by applying the first analog converter output voltage ($U_1$) and the second analog converter output voltage ($U_2$) to the at least one piezoelectric actuator.

18. A piezoelectric positioning device comprising:
at least one piezoelectric actuator comprising, respectively, a first connection contact and a second connection contact,
a control device configured to control the at least one piezoelectric actuator, and comprising:
  a first digital/analog converter connected to the first connection contact and providing a first analog converter output voltage $U_1$ in a first voltage range $\Delta U_1$ in first voltage levels $\Delta u_1$, wherein the first digital/analog converter has n bits and a first digital input of the first digital/analog converter accepts $2^n$ digital input values, wherein the first voltage levels $\Delta u_1$ are determined by the first voltage range $\Delta U_1$ and the $2^n$ digital input values,
  a second digital/analog converter connected to the second connection contact and providing a second analog converter output voltage $U_2$ in a second voltage range $\Delta U_2$ in second voltage levels $\Delta u_2$, wherein the second digital/analog converter has m bits and a second digital input of the second digital/analog converter accepts $2^m$ digital input values, wherein the second voltage levels $\Delta u_2$ are determined by the second voltage range $\Delta U_2$ and the $2^m$ digital input values, where: $\Delta U_1 > \Delta U_2 \geq \Delta u_1 > \Delta u_2$, wherein the second voltage range $\Delta U_2$ lies at least partially outside of the first voltage range $\Delta U_1$,
  a first voltage amplifier arranged downstream of the first digital/analog converter and a second voltage amplifier arranged downstream of the second digital/analog converter,
  a non-reactive resistor connected between the second voltage amplifier and the second connection contact, and
  a low-pass filter connected between the first digital/analog converter and the first voltage amplifier.

* * * * *

UNITED STATES PATENT AND TRADEMARK OFFICE
CERTIFICATE OF CORRECTION

PATENT NO. : 10,128,429 B2
APPLICATION NO. : 15/608397
DATED : November 13, 2018
INVENTOR(S) : Kempter et al.

Page 1 of 1

It is certified that error appears in the above-identified patent and that said Letters Patent is hereby corrected as shown below:

In the Specification

Column 7, Line 4-5 Delete "$\Delta U_2 \leq \Delta u_1 + \Delta u_d$, in particular $\Delta U_2 \geq \Delta u_1 + 2 \cdot u_d$." and insert
-- $\Delta U_2 \geq \Delta u_1 + \Delta u_d$, in particular $\Delta U_2 \geq \Delta u_1 + 2 \cdot \Delta u_d$. --, therefor.

Signed and Sealed this
Tenth Day of September, 2019

Andrei Iancu
*Director of the United States Patent and Trademark Office*